(12) United States Patent
Mazlout

(10) Patent No.: US 10,745,804 B2
(45) Date of Patent: Aug. 18, 2020

(54) PARALLEL SLIT TORCH FOR MAKING OPTICAL FIBER PREFORM

(71) Applicant: OFS Fitel, LLC, Norcross, GA (US)

(72) Inventor: Lazhar Mazlout, Duluth, GA (US)

(73) Assignee: OFS FITEL, LLC, Norcross, GA (US)

( * ) Notice: Subject to any disclaimer, the term of this patent is extended or adjusted under 35 U.S.C. 154(b) by 471 days.

(21) Appl. No.: 15/420,490

(22) Filed: Jan. 31, 2017

(65) Prior Publication Data

US 2018/0216227 A1  Aug. 2, 2018

(51) Int. Cl.
| | | |
|---|---|---|
| *C23C 16/453* | (2006.01) | |
| *C23C 16/26* | (2006.01) | |
| *C23C 16/455* | (2006.01) | |
| *C03B 19/14* | (2006.01) | |
| *C03B 37/014* | (2006.01) | |
| *F23D 14/58* | (2006.01) | |

(52) U.S. Cl.
CPC ........ *C23C 16/453* (2013.01); *C03B 19/1415* (2013.01); *C03B 19/1423* (2013.01); *C03B 37/0142* (2013.01); *C03B 37/01413* (2013.01); *C23C 16/26* (2013.01); *C23C 16/45504* (2013.01); *C23C 16/45574* (2013.01); *C03B 2207/02* (2013.01); *C03B 2207/10* (2013.01); *C03B 2207/12* (2013.01); *C03B 2207/18* (2013.01); *C03B 2207/60* (2013.01); *C23C 16/45563* (2013.01); *F23D 14/583* (2013.01)

(58) Field of Classification Search
None
See application file for complete search history.

(56) References Cited

U.S. PATENT DOCUMENTS

| | | | | |
|---|---|---|---|---|
| 3,790,087 A | * | 2/1974 | Banyas | B23B 31/18 239/418 |
| 3,876,149 A | * | 4/1975 | Futerko | B23P 15/00 239/398 |
| 4,062,665 A | * | 12/1977 | Izawa | C03B 37/014 65/391 |
| 4,136,828 A | * | 1/1979 | Anderson | C03B 19/1423 239/422 |
| 4,203,553 A | * | 5/1980 | Bachman | B01J 12/005 239/288 |
| 4,224,046 A | * | 9/1980 | Izawa | C03B 37/0142 65/413 |

(Continued)

FOREIGN PATENT DOCUMENTS

| | | | | |
|---|---|---|---|---|
| JP | 55010459 A | * | 1/1980 | ......... C03B 37/0142 |
| JP | S55010459 A | | 1/1980 | |

(Continued)

*Primary Examiner* — Jeffrie R Lund
*Assistant Examiner* — Stanislav Antolin
(74) *Attorney, Agent, or Firm* — Smith Tempel Blaha LLC; Larry Maxwell, Esq.

(57) ABSTRACT

A torch for fabricating optical fiber preforms may include a body having a surface and two or more slit-shaped orifices oriented parallel or substantially parallel to each other along the surface. The torch body may further include two or more conduits connected to corresponding orifices. The torch may be used by orienting it relative to a preform substrate, and simultaneously emitting two or more gases from corresponding orifices toward the surface of the preform substrate, such that the gases are involved in a reaction to form a soot.

7 Claims, 11 Drawing Sheets

(56) References Cited

U.S. PATENT DOCUMENTS

| | | | | |
|---|---|---|---|---|
| 4,345,928 A * | 8/1982 | Kawachi | C03B 37/014 | 65/412 |
| 4,368,063 A * | 1/1983 | Presby | C03B 23/0473 | 29/455.1 |
| 4,414,012 A * | 11/1983 | Suto | C03B 19/102 | 65/30.1 |
| 4,618,354 A * | 10/1986 | Suda | C03B 37/014 | 65/416 |
| 4,682,994 A * | 7/1987 | Mansfield | C03B 37/0142 | 65/421 |
| 4,826,520 A * | 5/1989 | Kawazoe | C03B 37/0142 | 239/416 |
| 4,880,163 A * | 11/1989 | Kobayashi | C23C 16/453 | 239/422 |
| 4,915,716 A * | 4/1990 | Monroe | C03B 37/0142 | 427/166 |
| 4,915,717 A * | 4/1990 | Watanabe | C03B 37/0142 | 65/144 |
| 5,073,106 A * | 12/1991 | Toyonaga | F23D 14/26 | 126/92 R |
| 5,224,855 A * | 7/1993 | Toyonaga | F23D 14/26 | 126/92 R |
| 5,683,516 A * | 11/1997 | DeDontney | C03C 17/002 | 118/715 |
| 5,735,928 A * | 4/1998 | Sayce | C03B 19/1423 | 65/531 |
| 5,958,348 A * | 9/1999 | Bi | B01J 12/005 | 266/168 |
| 6,003,342 A * | 12/1999 | Ishida | C03B 37/0142 | 118/627 |
| 6,189,214 B1 * | 2/2001 | Skeath | B05B 1/08 | 29/890.142 |
| 6,336,347 B1 * | 1/2002 | Roba | C03B 19/1415 | 65/413 |
| 6,513,736 B1 * | 2/2003 | Skeath | B05B 1/08 | 239/548 |
| 6,588,230 B1 * | 7/2003 | Adler | C03B 19/1407 | 239/416 |
| 6,630,030 B1 * | 10/2003 | Suntola | C23C 16/45523 | 118/728 |
| 6,736,633 B1 * | 5/2004 | Dawson-Elli | C03B 19/1423 | 239/418 |
| 2002/0073737 A1 * | 6/2002 | Ooishi | C03B 37/0142 | 65/382 |
| 2002/0116955 A1 * | 8/2002 | Enomoto | C03B 37/0142 | 65/415 |
| 2002/0174690 A1 * | 11/2002 | Gouskov | C03B 37/01426 | 65/382 |
| 2002/0189298 A1 * | 12/2002 | Arima | C03B 37/0148 | 65/531 |
| 2003/0113679 A1 * | 6/2003 | Bakshi | C03B 37/0142 | 431/154 |
| 2003/0167796 A1 * | 9/2003 | Hawtof | C01B 13/20 | 65/17.4 |
| 2003/0233849 A1 * | 12/2003 | Shimada | C03B 37/01202 | 65/382 |
| 2004/0017987 A1 * | 1/2004 | Yamada | G02B 6/2552 | 385/123 |
| 2004/0190846 A1 * | 9/2004 | Nakamura | C03B 37/01433 | 385/123 |
| 2004/0250767 A1 * | 12/2004 | Langlois | C23C 16/042 | 118/715 |
| 2005/0118411 A1 * | 6/2005 | Home | B82Y 30/00 | 428/323 |
| 2006/0003279 A1 * | 1/2006 | Best | A47J 37/0676 | 431/328 |
| 2006/0021517 A1 * | 2/2006 | Best | A47J 37/0676 | 99/451 |
| 2009/0126407 A1 * | 5/2009 | Bookbinder | C03B 37/0183 | 65/391 |
| 2009/0155493 A1 * | 6/2009 | Lewis | C03C 17/002 | 427/586 |
| 2010/0129561 A1 * | 5/2010 | McLean | C03C 17/002 | 427/446 |
| 2010/0143601 A1 * | 6/2010 | Hawtof | F23D 14/08 | 427/446 |
| 2010/0323311 A1 * | 12/2010 | Yoshida | C03B 19/1423 | 431/187 |
| 2011/0067632 A1 * | 3/2011 | Poppe | C23C 16/4412 | 118/728 |
| 2011/0081486 A1 * | 4/2011 | McCamy | C23C 16/4401 | 427/255.19 |
| 2011/0097494 A1 * | 4/2011 | Kerr | C23C 16/45551 | 427/255.5 |
| 2011/0159198 A1 * | 6/2011 | McLean | C23C 16/453 | 427/446 |
| 2011/0159199 A1 * | 6/2011 | McLean | C03C 17/002 | 427/446 |
| 2011/0244411 A1 * | 10/2011 | Rochat | F23D 14/10 | 431/354 |
| 2011/0318905 A1 * | 12/2011 | Chiruvolu | C09D 7/68 | 438/478 |
| 2013/0323463 A1 * | 12/2013 | Geremew | C03B 19/1423 | 428/141 |
| 2014/0352361 A1 * | 12/2014 | Dawes | C03B 37/012 | 65/397 |
| 2015/0211123 A1 * | 7/2015 | Glukhoy | C23C 16/453 | 118/712 |
| 2016/0123581 A1 * | 5/2016 | Asikkala | C03B 37/0142 | 65/382 |

FOREIGN PATENT DOCUMENTS

| | | | | |
|---|---|---|---|---|
| JP | 58161929 A * | 9/1983 | | C03B 19/1423 |
| JP | 63242939 A * | 10/1988 | | C03B 37/0142 |
| JP | 02219901 A * | 9/1990 | | F23D 14/583 |
| JP | H089488 B2 * | 1/1996 | | C03B 37/0142 |
| JP | H09500082 A | 1/1997 | | |
| JP | 2000272925 A | 10/2000 | | |

* cited by examiner

PARALLEL SLIT TORCH FOR MAKING OPTICAL FIBER PREFORM

BACKGROUND

In optical fiber manufacturing processes, fiber is drawn from a large-diameter glass structure known as a preform. Processes for making a preform include outside vapor deposition (OVD) and vapor axial deposition (VAD). In such processes, a porous glass structure known as a soot body or soot core is formed by depositing particles onto a glass seed rod (also known as a bait rod). The soot body is then condensed into a more solid structure known as a core body. The core body is then further processed into a preform.

In OVD, gases such as silicon tetrachloride, oxygen, and hydrogen, are reacted in a torch flame, and the resulting particles, known as soot, are deposited on the seed rod. The reaction occurs along the gas stream until a portion of the soot is deposited. Uniformity of the deposited soot is desirable and depends on many factors. The torch may include multiple orifices. For example, the torch may include a central tube or orifice as well as one or more concentric tubes or orifices surrounding the central orifice. The various orifices may be configured to emit different gases, some of which are reactants or reaction-supporting gases, and others of which may be shield or inert gases that help contain or otherwise control the reaction. The torch may be traversed by a mechanical carriage back and forth along a rotated seed rod until a sufficient amount of soot is deposited. It is very important that the soot be uniformly deposited. If the traverse is too fast, soot may build in a helical bubble or non-uniformity on the surface of the structure. If the traverse is too slow, soot may build in an undesirably thick and non-uniform manner on the surface.

Linear burners or torches having a length corresponding to the length of the seed rod have been suggested for use in OVD. A linear torch may have multiple orifices evenly distributed along its length. Alternatively, a linear torch may have a grating comprising slit-shaped openings extending substantially along its length that similarly serves as an orifice. A linear torch directed generally at the exposed semi-cylindrical surface of a seed rod may undesirably deposit soot more thickly at points closer to the torch and more thinly at points farther from the torch.

In VAD, the torch is directed at the base of the seed rod, and the seed rod is gradually drawn away from the torch as the soot builds up. Although VAD may have certain advantages over OVD, VAD may be more difficult to control with sufficient precision than OVD, due to the tapering diameter of the soot growth surface at the base. Known linear torches may be poorly suited for VAD because they may not deposit soot uniformly.

SUMMARY

Embodiments of the invention relate to a torch for fabricating optical fiber preforms. An exemplary torch may include a body having a surface and plurality of slit-shaped orifices oriented parallel or substantially parallel to each other along the surface. The torch body may further include a plurality of conduits. The proximal end of each conduit may be coupled to a different one of the slit-shaped orifices.

An exemplary method for using the torch in making optical fiber preforms may include disposing the torch in an orientation with the surface substantially parallel to a surface of a substantially cylindrical preform substrate, and simultaneously emitting at least a first gas and a second gas from respective parallel or substantially parallel first and second slit-shaped orifices toward the surface of the preform substrate. The emitted first and second gases are involved in a reaction to form a soot on the surface of the preform substrate.

Other systems, methods, features, and advantages will be or become apparent to one of skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
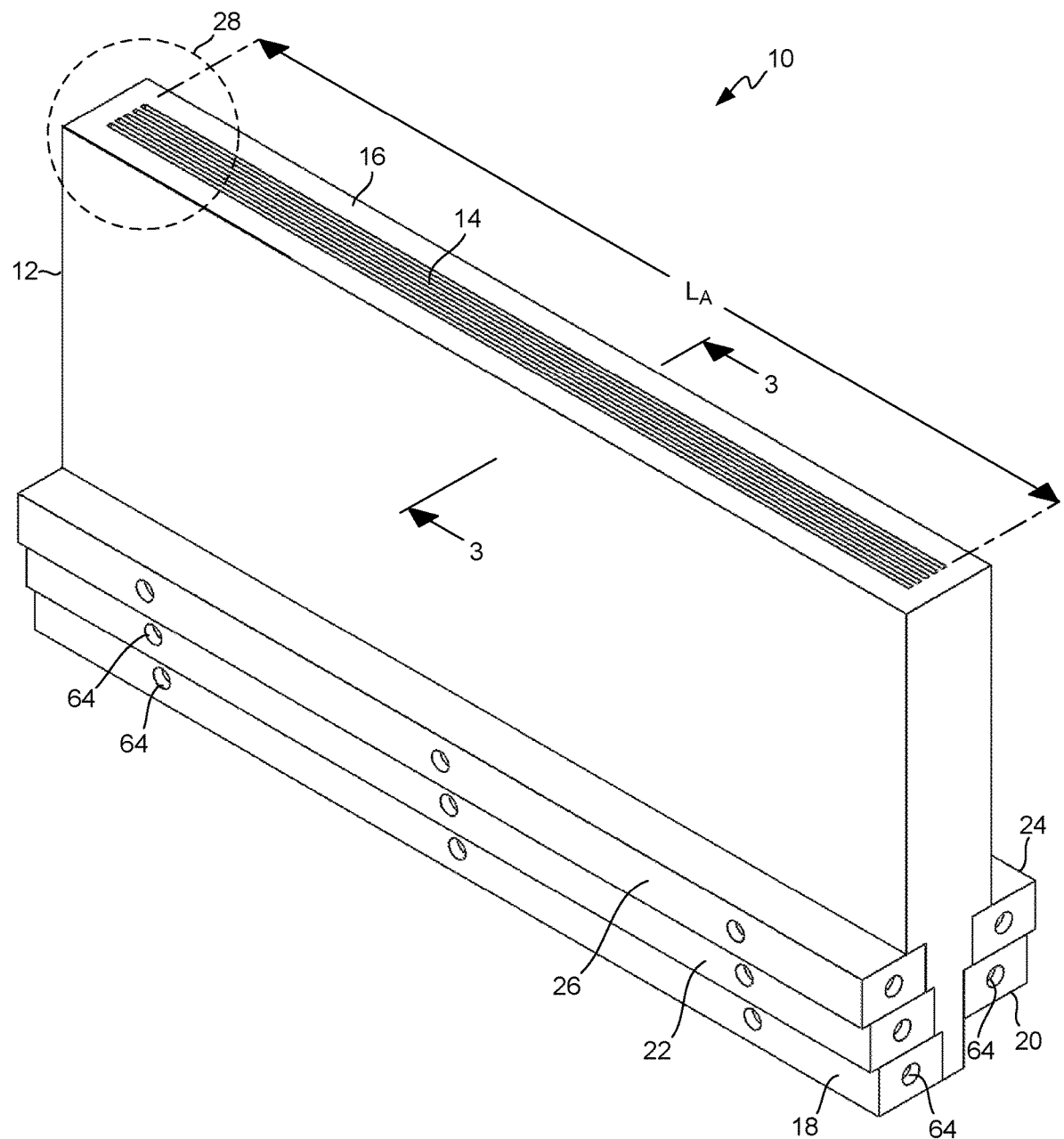
FIG. 1 is a perspective view of an exemplary torch for making optical fiber preforms.

As illustrated in FIG. 1, in an illustrative or exemplary embodiment of the invention, a torch 10 includes a torch body 12 having an array of substantially rectangular, slit-shaped orifices 14 oriented parallel to each other. The array of orifices 14 defines a surface, which in the illustrated embodiment is co-planar with a top surface 16 of torch body 12. Torch 10 further includes manifolds 18, 20, 22, 24, and 26.

Figure 2:
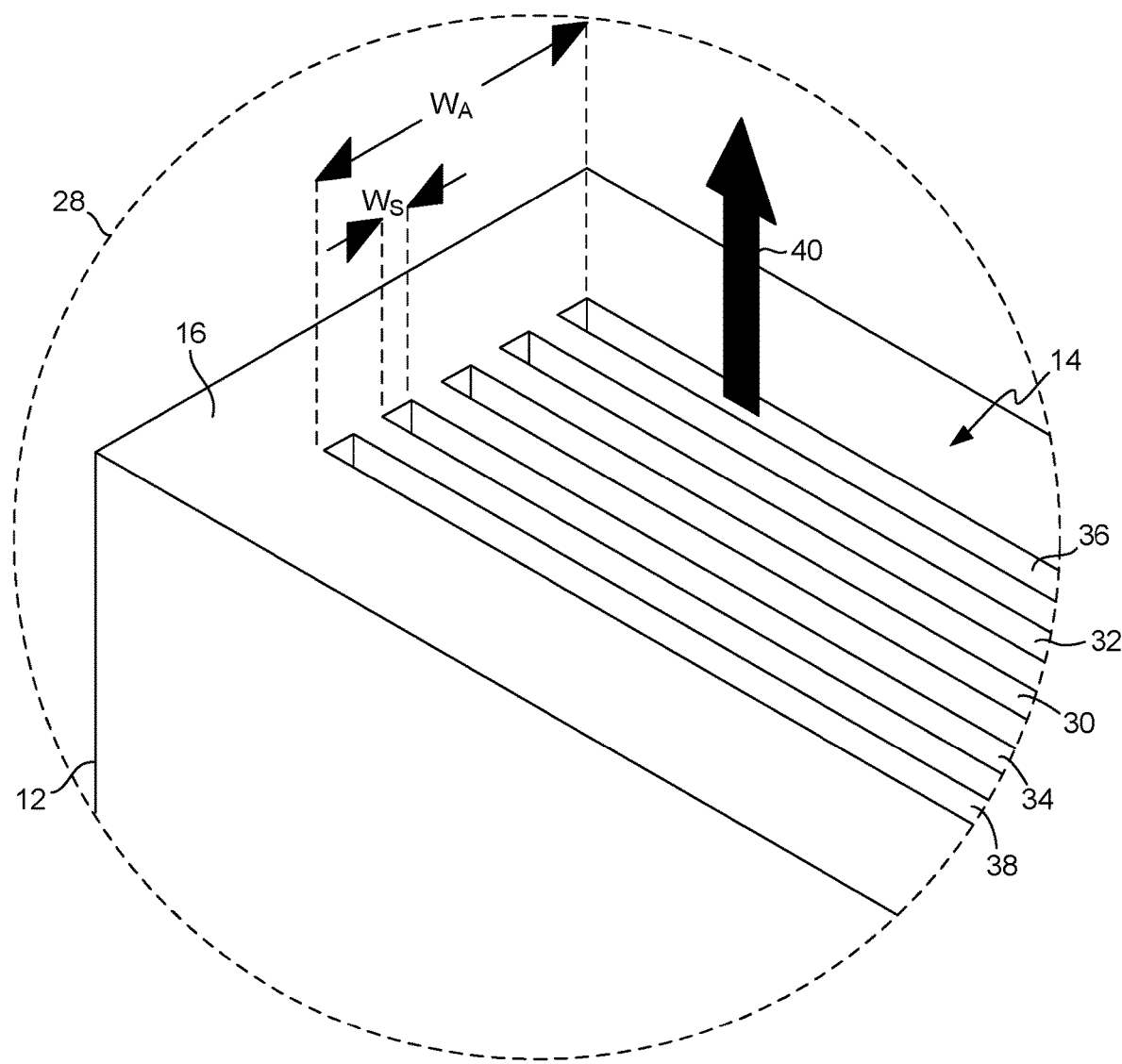
FIG. 2 is an enlargement of a portion of FIG. 1.

An enlarged portion 28 of FIG. 1 is described in further detail with regard to FIG. 2. As illustrated in FIG. 2, the array of orifices 14 may comprise, for example, a first orifice 30, a second orifice 32, a third orifice 34, a fourth orifice 36, and a fifth orifice 38. It should be understood that the terms "first," "second," "third," etc., are used herein for purposes of clarity of identification and not to indicate order or relative location. Although in the embodiment illustrated in FIGS. 1-4 torch 10 includes five orifices 30-38, in other embodiments such a torch may include any number of such parallel or substantially parallel, slit-shaped orifices. The term "slit-shaped" as used in this disclosure means that the length of each of orifices 30-38 is many times its width ("$W_S$"). In the embodiment illustrated in FIGS. 1-4, the width ("$W_S$") of each of orifices 30-38 is constant or uniform along its length, thereby defining the rectangular shape of each of orifices 30-38 as well as the rectangular shape of the array of orifices 14 as a whole. Nevertheless, as described below, in other embodiments the orifice width may vary (e.g., increase, decrease, etc.) along its length. In the embodiment illustrated in FIGS. 1-4, the width ("$W_S$") of each of orifices 30-38 may be, for example, on the order of one millimeter.

In the embodiment illustrated in FIGS. 1-4, the spacing between adjacent ones of orifices 30-38 may be less than the width ("$W_S$") of each of the orifices 30-38. For example, the spacing may be no greater than necessary to provide structural integrity. In other embodiments different orifices may be spaced apart by different amounts. Also, in other embodiments such inter-orifice spacing may vary (e.g., increase, decrease, etc.) along the lengths of the orifices. In the embodiment illustrated in FIGS. 1-4, the array of orifices 14 (comprising orifices 30-38) has a total array width "$W_A$" and a total array length "$L_A$." The total array length ("$L_A$") may be, for example, at least 10 times the total array width ("$W_A$"). It may be noted that in an embodiment in which the orifice width and inter-orifice spacing are uniform, and in which the inter-orifice spacing is approximately equal to the orifice width, the total array width ("$W_A$") is approximately ($W_S$)×(2N−1), where N is the total number of orifices.

As described below with regard to a method for using torch 10, some of orifices 30-38 may be configured to emit different gases than others of orifices 30-38. Orifices 30-38 that are immediately adjacent to each other may be grouped together. A group of two or more orifices 30-38 may include orifices 30-38 on both sides of another group of orifices 30-38. A group of orifices 30-38 may be configured to emit a different gas than another group of orifices 30-38. For example, a first group consisting of first orifice 30 may be configured to emit a first gas, while a second group consisting of second and third orifices 32 and 34 may be configured to emit a second gas, and a third group consisting of fourth and fifth orifices 36 and 38 may be configured to emit a third gas. The first gas may be, for example, silicon tetrachloride, while the second and third gases may be, for example, oxygen and hydrogen, respectively. In the illustrated embodiment, orifice 30 of the first group is centrally located with respect to the second and third groups. That is, first orifice 30 is located between second orifice 32 and third orifice 34, second orifice 32 is located between first orifice 30 and fourth orifice 36, and third orifice 34 is located between first orifice 30 and fifth orifice 38. Stated another way, in the illustrated embodiment, the second group, consisting of orifices 32 and 34, flanks the first group, consisting of orifice 30, and the third group, consisting of orifices 36 and 38, flanks the second group. Although in the illustrated embodiment torch 10 includes five orifices 30-38 grouped into three groups, in other embodiments such a torch may include any number of orifices grouped in any manner. For example, a fourth group of two orifices (not shown) flanking the third group can be further included. An inert shielding gas, such as argon, helium, or nitrogen, may be emitted from the fourth group of orifices. Although in the illustrated embodiment each group consists of only one or two orifices, in other embodiments a group can have any number of orifices. Each of orifices 30-38 is configured to emit a gas in a laminar or non-turbulent manner in a direction indicated by an arrow 40.

Figure 3:
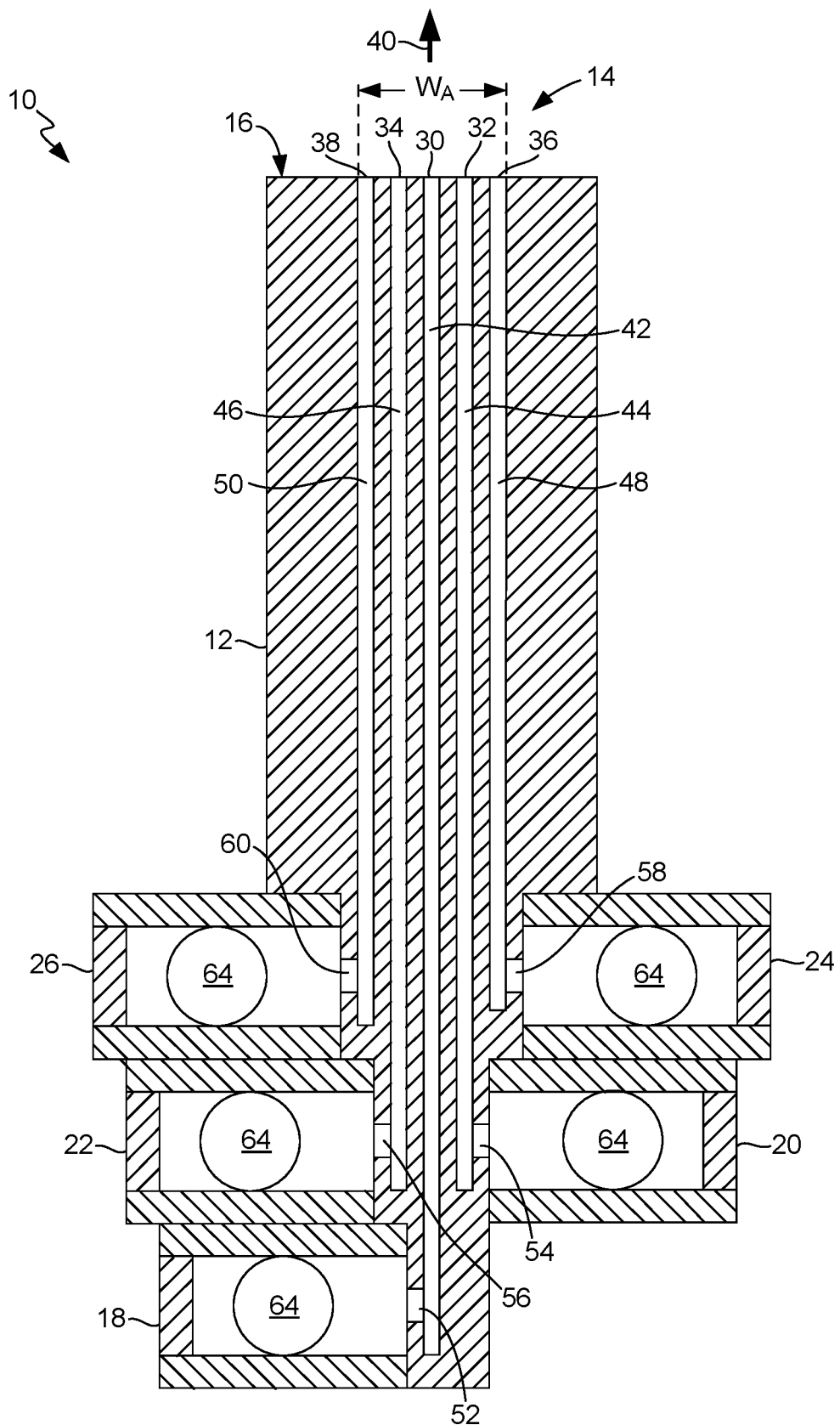
FIG. 3 is a sectional view taken on line 3-3 of FIG. 1.
Figure 4:
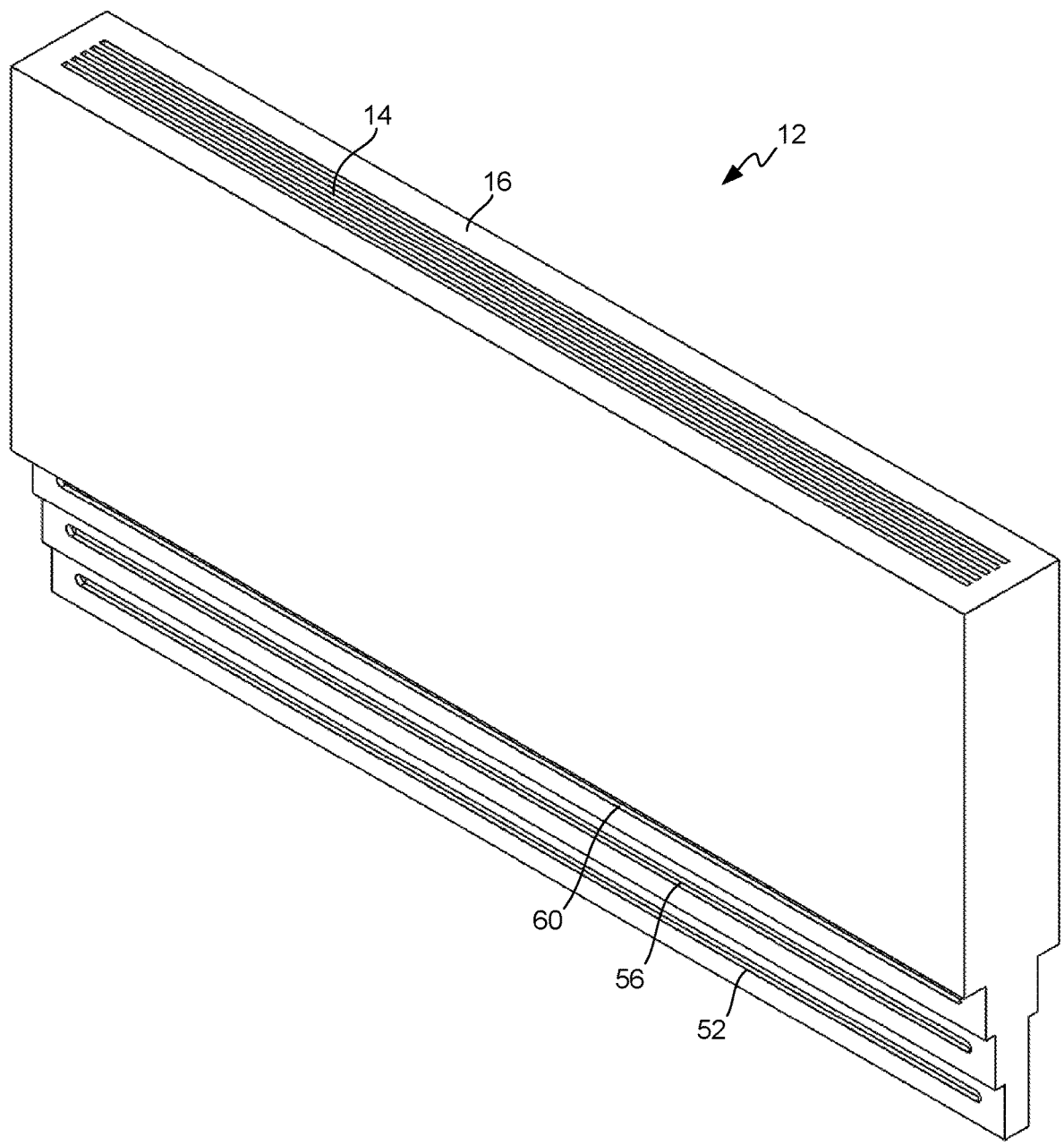
FIG. 4 is similar to FIG. 1, showing the torch body without the manifolds.

As illustrated in FIG. 3, a proximal end of a first conduit 42 is connected to and defines first orifice 30, a proximal end of a second conduit 44 is connected to and defines second orifice 32, a proximal end of a third conduit 46 is connected to and defines third orifice 34, a proximal end of a fourth conduit 48 is connected to and defines fourth orifice 36, and a proximal end of a fifth conduit 50 is connected to and defines fifth orifice 38. Each of conduits 42-50 is elongated and has a cross-sectional shape corresponding to that of orifices 30-38 to promote laminar or non-turbulent flow. Conduits 42-50 are elongated in a direction normal to surface 16, between their proximal and distal ends.

Figure 5:
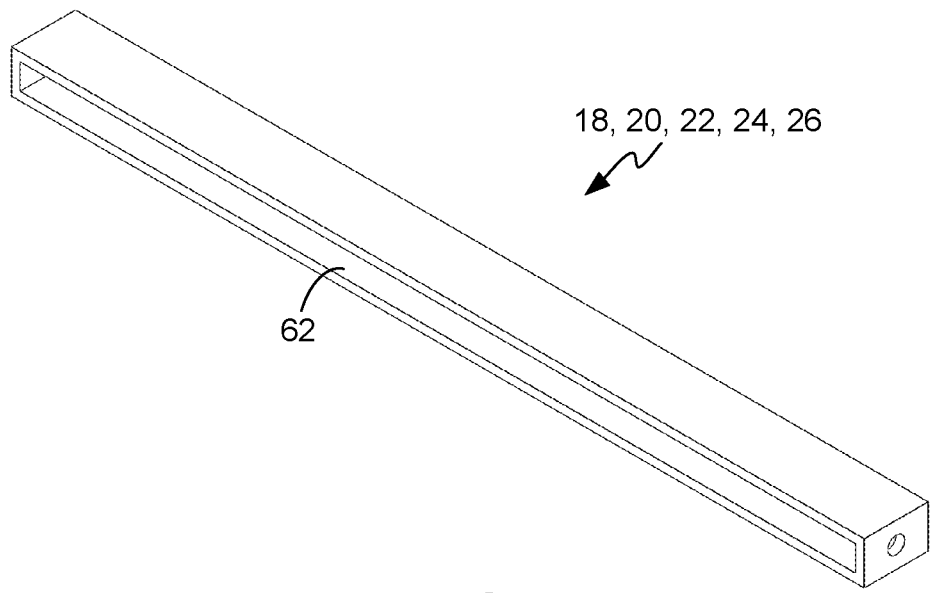
FIG. 5 is a perspective view of one side of a manifold.
Figure 6:
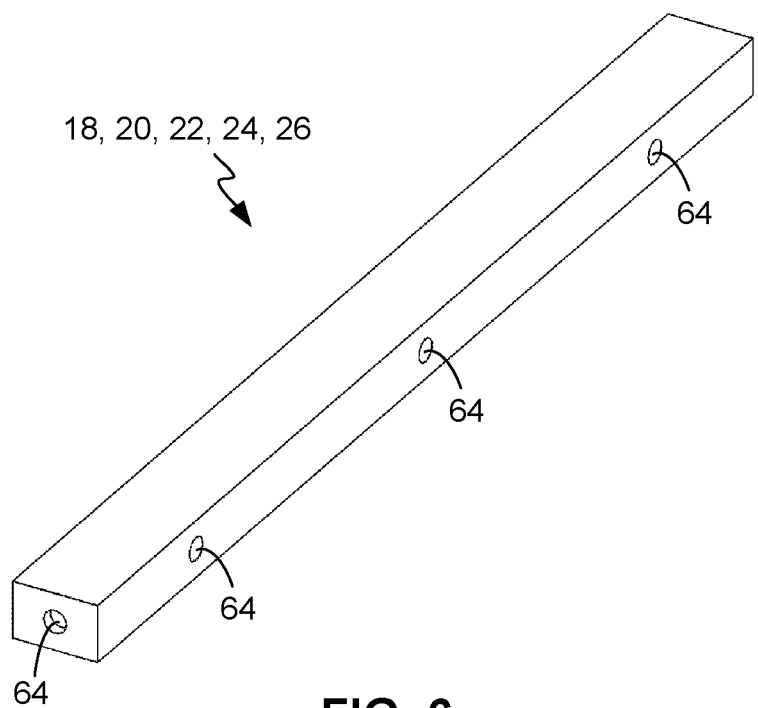
FIG. 6 is a perspective view of another side of the manifold.

Torch body 12 includes orifices 52, 54, 56, 58, and 60 near the distal ends of conduits 42, 44, 46, 48, and 50, respectively. (See also FIG. 4.) In the illustrated embodiment, orifices 52-60 are slit-shaped correspondingly with orifices 30-38. Manifolds 18-26 are longer than orifices 52-60. An interior side of each of manifolds 18-26, defined by a cavity 62 (FIG. 5), faces a corresponding one of orifices 52-60. An exterior side of each of manifolds 18-26 (FIG. 5) includes one or more gas inlets 64. In the illustrated embodiment, two opposing gas inlets 64 are correspondingly located on the opposing ends of each of manifolds 18-26, and three other gas inlets 64 are located along the side of each of manifolds 18-26. Nevertheless, in other embodiments (not shown), such a manifold may have such gas inlets located on one end only, or any other combination of locations. Also, although in the illustrated embodiment each of manifolds 18-26 has five gas inlets 64, in other embodiments there may be any number of such gas inlets. Although in the illustrated embodiment gas inlets 64 have circular shapes to facilitate connection to conventional gas sources and pipe systems, in other embodiments such gas inlets may have any other shape.

Figure 7:
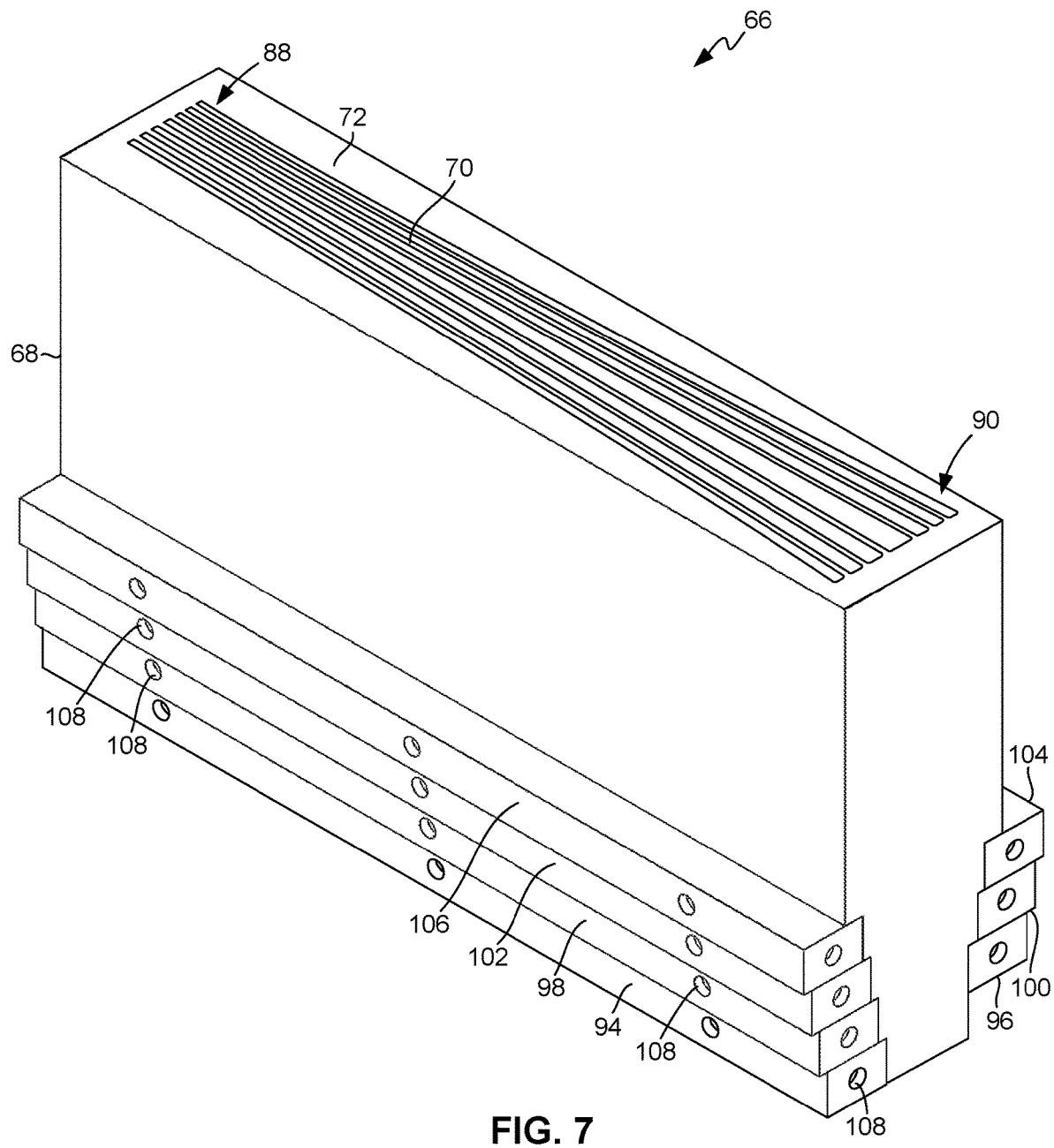
FIG. 7 is a perspective view of another exemplary torch for making optical fiber preforms.

As illustrated in FIG. 7, in another embodiment, a torch 66 includes a torch body 68 having an array of slit-shaped orifices 70 oriented substantially parallel to each other. The array of orifices 70 defines a surface, which in the illustrated embodiment is co-planar with a top surface 72 of torch body 68. The term "substantially parallel" as used in this disclosure means parallel at some, but not necessarily all, points along their lengths. The term "substantially parallel" thus encompasses entirely or completely parallel within its scope of meaning.

Figure 8:
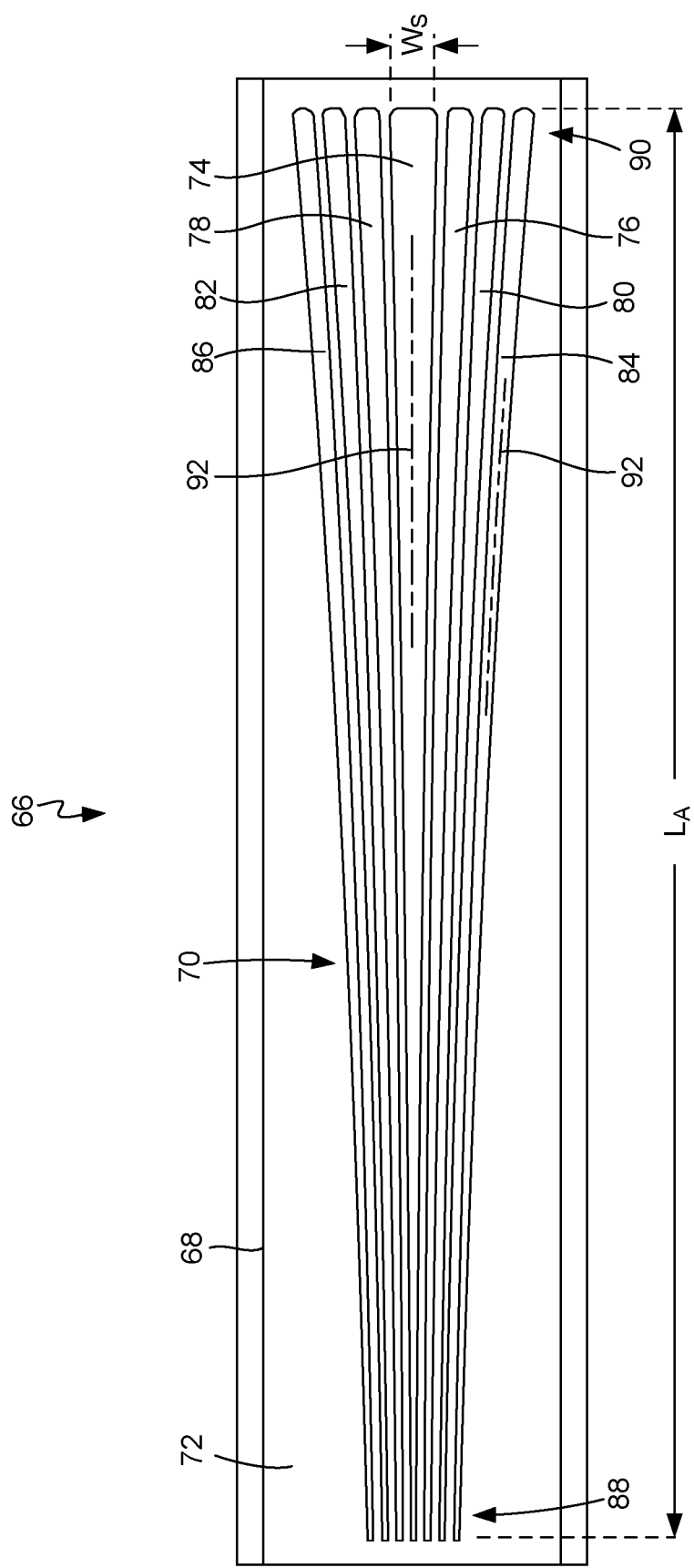
FIG. 8 is a top plan view of the torch of FIG. 7.

As shown in further detail in FIG. 8, the array of orifices 70 comprises a first orifice 74, a second orifice 76, a third orifice 78, a fourth orifice 80, a fifth orifice 82, a sixth orifice 84, and a seventh orifice 86. As the array of orifices 70 forms a fan-shaped pattern, orifices 70 are substantially parallel to each other. Although in the embodiment illustrated in FIGS. 7-8 torch 66 includes seven orifices 74-86, in other embodiments such a torch may include any number of such substantially parallel, slit-shaped orifices. Each of orifices 74-86 has a tapering width ("$W_S$"). That is, each of orifices 74-86 is narrower near a first end 88 of surface 72 and wider near a second end 90 of surface 72. Also, the center lines or longitudinal axes 92 of orifices 74-86 are not exactly parallel to each other at all points along their lengths, but rather are only substantially parallel because they diverge from each other in a fan-shaped pattern. Other features of torch 66 may be similar to those of above-described torch 10 and are therefore not described in similar detail. For example, torch 66 includes manifolds 94, 96, 98, 100, 102, 104, and 106 that are similar to above-described manifolds 18, 20, 22, 24, and 26. Manifolds 94-106 include gas inlets 108. Also, although not shown for purposes of clarity, orifices 74-86 are connected to manifolds 94-106 via conduits similar to above-described conduits 42-50.

Figure 9:
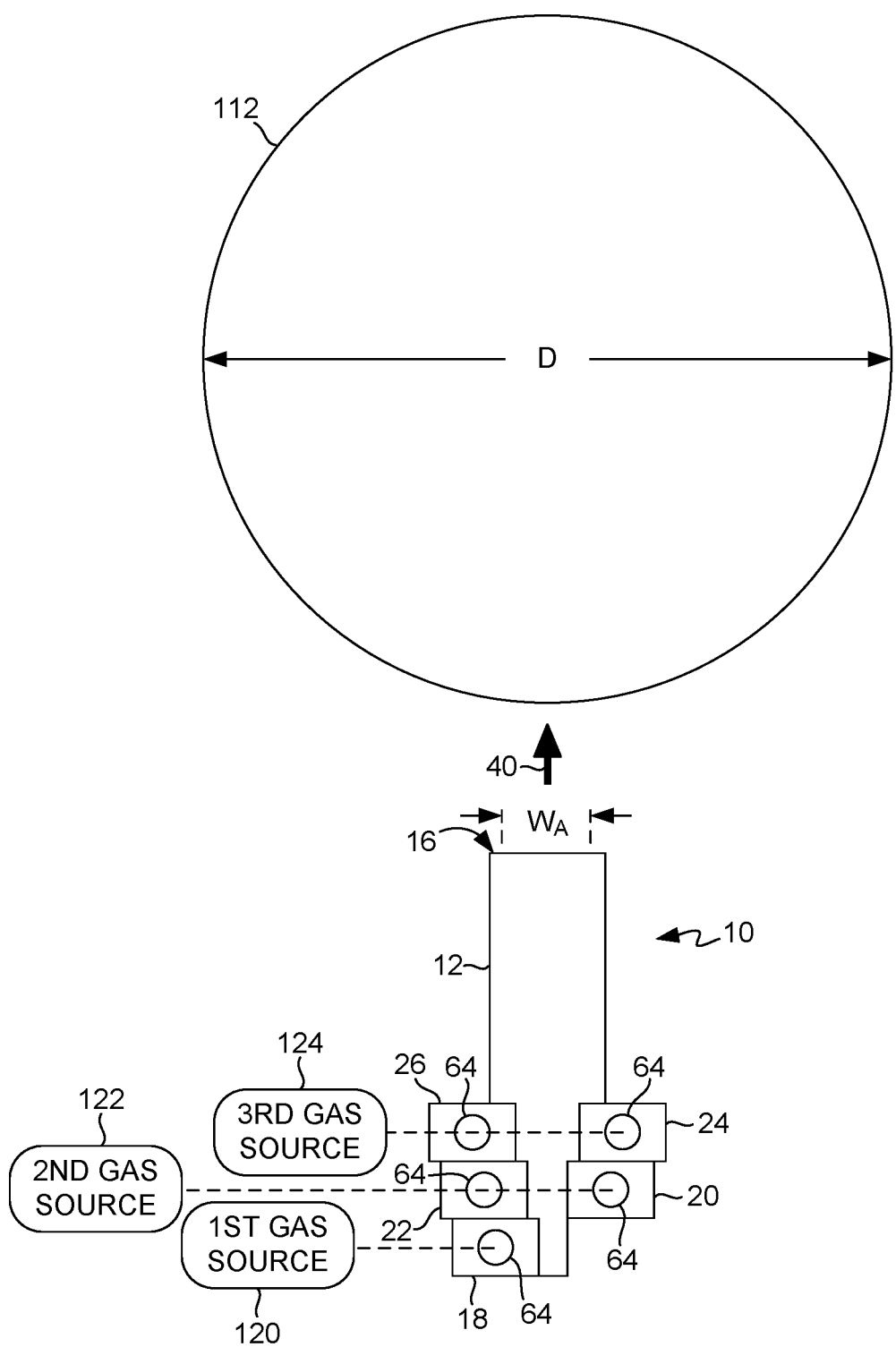
FIG. 9 is an end elevation view of the torch of FIG. 1, shown in relation to a preform substrate.
Figure 10:
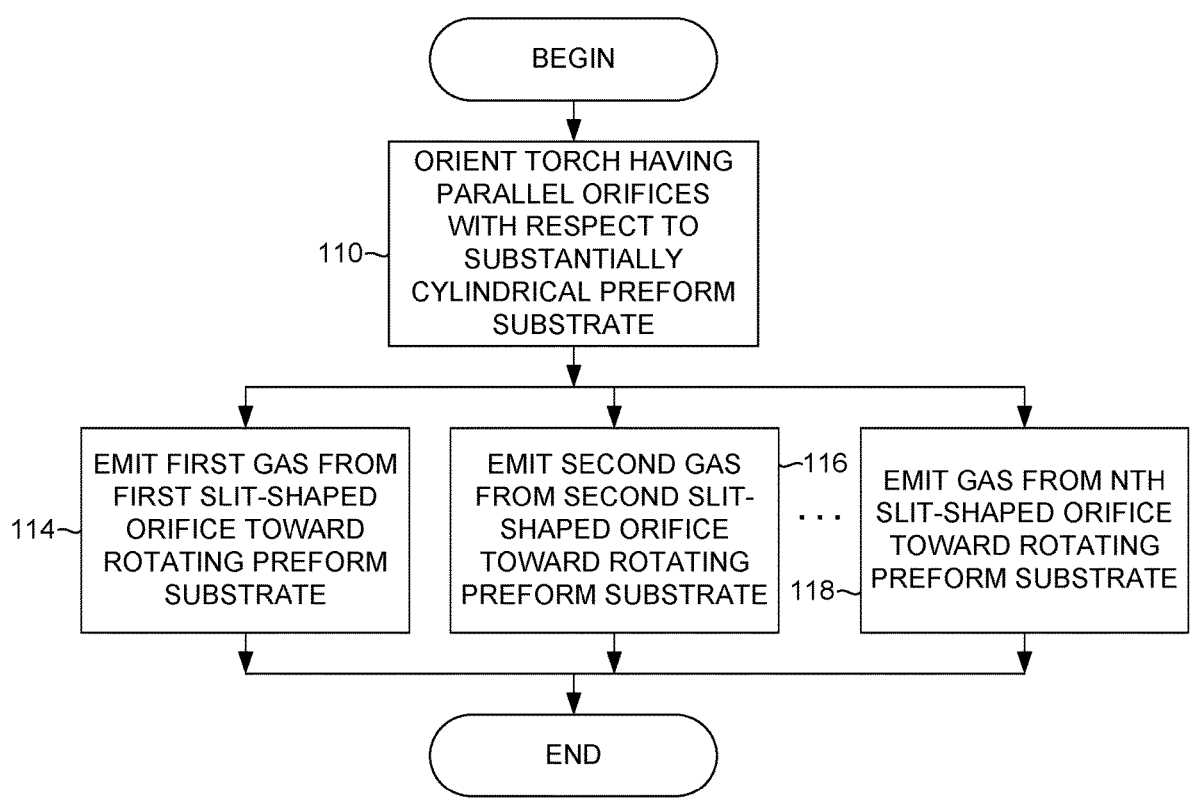
FIG. 10 is a flow diagram illustrating an exemplary method for making optical fiber preforms.

As illustrated by FIGS. 9-10, torch 10 may be used in an exemplary method to fabricate an optical fiber preform. As indicated by block 110 (FIG. 10), torch 10 may be disposed in an orientation in which surface 16 of torch body 12 is substantially parallel to a soot growth surface of a substantially cylindrical preform substrate 112 (FIG. 9). Accordingly in this orientation, each of orifices 30-38 (FIGS. 2-3) at surface 16 is substantially parallel to the soot growth surface of preform substrate 112. Note in FIG. 9 that the total array width ("$W_A$") is substantially less than the diameter ("D") of preform substrate 112. For example, the total array width ("$W_A$") may be less than one-half the diameter ("D") of preform substrate 112.

Preform substrate 112 initially may comprise a conventional glass seed rod of a type commonly used in OVD or similar processes. As the process proceeds and soot is deposited on the seed rod, preform substrate 112 may be referred to as a soot body or soot core. As such a seed rod, soot body, or other preform substrate 112 and its use in OVD or similar process are well understood by one of ordinary skill in the art, such aspects are not described in further detail herein. Similarly, as the manner in which preform substrate 112 is retained and rotated or otherwise manipulated in OVD or similar processes is well understood by one of ordinary skill in the art, such aspects are not described in further detail herein.

With torch 10 and preform substrate 112 oriented with respect to each other as described above, a plurality of gases are then simultaneously and separately emitted from torch 10 and reacted along the gas stream until they deposit onto the soot growth surface of preform substrate 112. For example, as indicated by block 114 (FIG. 10), a first orifice may emit a first gas. As indicated by block 116, simultaneously with the emission of the first gas, a second orifice may emit a second gas that is different from the first gas. Stated generally, in this exemplary method each of N orifices (i.e., the total number of orifices) emits a stream of gas separately and independently from the other orifices, and at least some of the gases emitted by the various orifices are different from each other. Accordingly, as indicated by block 118, simultaneously with the emission of other gases from other orifices, an Nth orifice emits a gas. The emission of gases from additional or further orifices is indicated by the ellipsis symbol (" . . . ") between blocks 116 and 118.

In an example, the first gas may be a glass precursor, such as silicon tetrachloride, emitted by first orifice 30. Also in this example, the second gas may be oxygen, emitted by both second and third orifices 32 and 34. Further in this example, a third gas may be hydrogen, emitted by both fourth and fifth orifices 36 and 38. Still other gases may be emitted by still other orifices.

As illustrated in FIG. 9, in accordance with the foregoing example, a first gas source 120 may be coupled to gas inlets 64 of manifold 18. A second gas source 122 may be coupled to gas inlets 64 of manifolds 20 and 22. A third gas source 124 may be coupled to gas inlets 64 of manifolds 24 and 26. For purposes of clarity, conventional pipes and control systems that provide such coupling are not shown in detail, but are understood by one of ordinary skill in the art.

The gases are emitted from orifices 30-38 (at surface 16 in FIG. 9) in the direction indicated by arrow 40 toward the surface of preform substrate 112. At least some of the gases, such as the first, second, and third gases, react to form a soot on the surface of preform substrate 112. In accordance with conventional OVD principles, as the gases are emitted and reacted, preform substrate 112 is rotated to promote even soot deposition around the surface of preform substrate 112. As the soot grows, the diameter ("D") of preform substrate 112 increases.

Although this exemplary embodiment relates to an oxygen-hydrogen reaction process, the method is similarly applicable to processes involving methane or other fuel or reactant gases. Also, in other embodiments additional orifices may emit non-reactive or inert gases, such as argon, helium, or nitrogen. As the manner in which such gases react to form a soot on preform substrate 112 in accordance with OVD and similar processes is well understood by one of ordinary skill in the art, such aspects are not described in further detail herein. It should be noted that because the array of orifices 14 may have a length ("$L_A$") (FIG. 1) substantially equal to the length of preform substrate 112, soot is deposited substantially uniformly (i.e., uniform soot density) along the length of preform substrate 112.

Although not described herein for purposes of clarity, the method may include additional steps associated with conventional OVD or similar processes. In view of the descriptions herein, one of ordinary skill in the art readily will be capable of using torches in accordance with the present invention in association with conventional OVD or similar processes.

Figure 11:
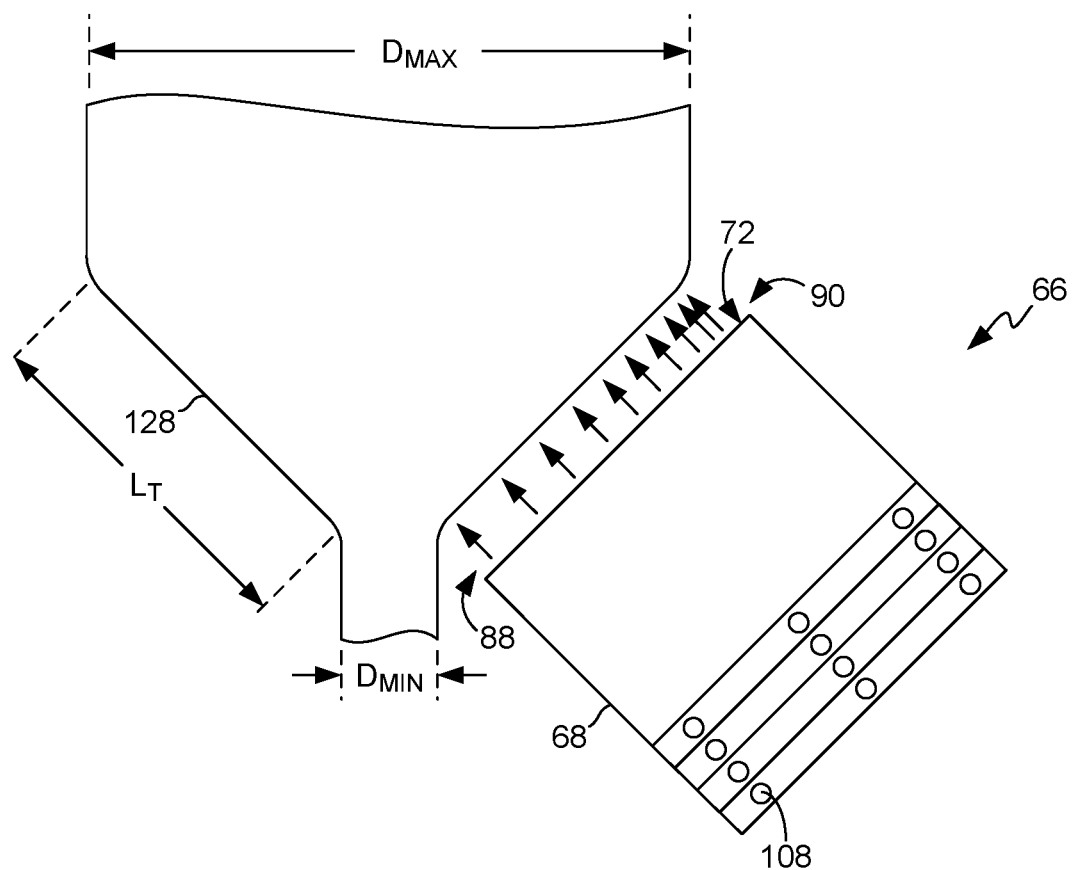
FIG. 11 is a side elevation view of the torch of FIG. 7, shown in relation to a preform substrate.
Figure 12:
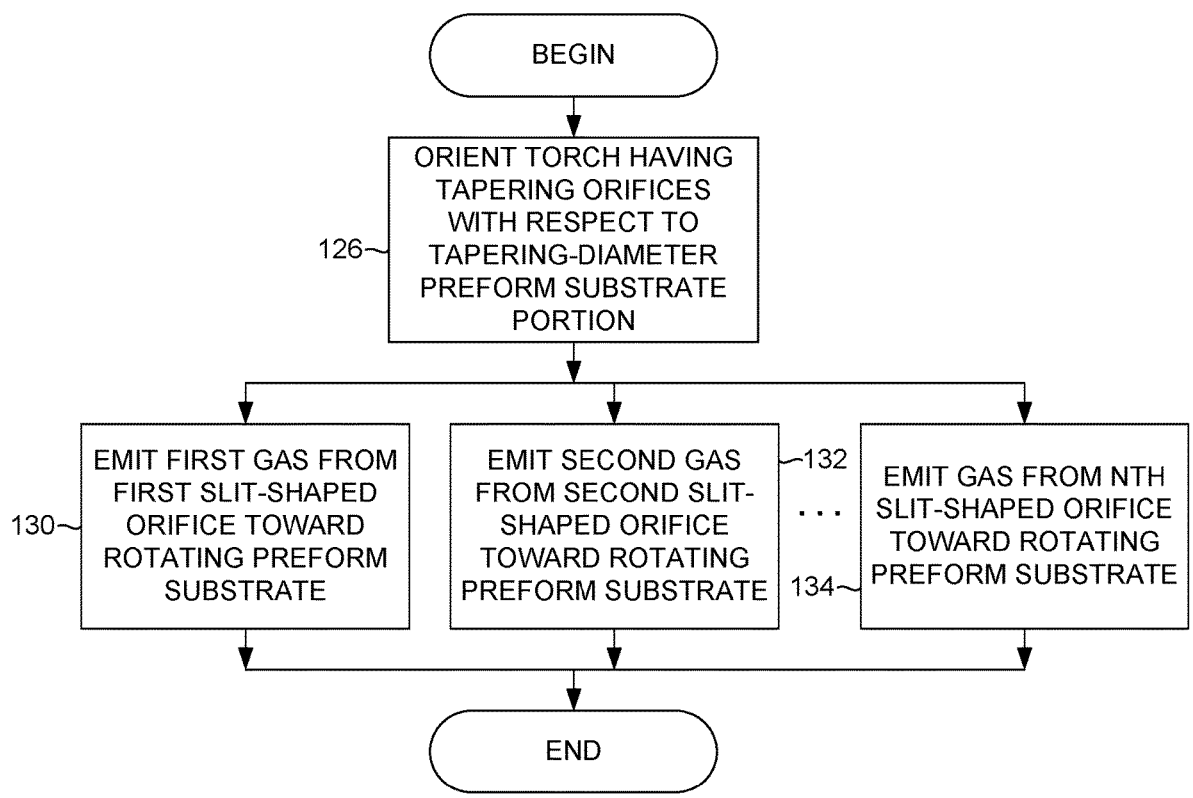
FIG. 12 is a flow diagram illustrating another exemplary method for making optical fiber preforms.

As illustrated by FIGS. 11-12, torch 66 (FIGS. 7-8) may be used in an exemplary method to fabricate an optical fiber preform. It should be noted that FIG. 11 depicts the method or process at a point in time after soot growth has begun. As indicated by block 126 (FIG. 12), torch 66 is disposed at such time in an orientation in which the surface 72 of torch body 68 is substantially parallel to a soot growth surface of a tapering-diameter portion of a preform substrate 128 (FIG. 11). This portion of preform substrate 128 tapers in diameter from a maximum diameter ("$D_{MAX}$") to a minimum diameter ("$D_{MIN}$"). Accordingly, in this orientation each of orifices 74-86 (FIG. 8) of the array of orifices 70 is substantially parallel to the soot growth surface of the tapering-diameter portion of preform substrate 128. In this embodiment, the first end 88 of surface 72, at which orifices 74-86 are narrower, is disposed adjacent the narrower end ("$D_{MIN}$") of preform substrate 128, and the second end 90 of surface 72, at which orifices 74-86 are wider, is disposed adjacent the wider end ("$D_{MAX}$") of preform substrate 128. Similarly to the method embodiment described above with regard to FIGS. 9-10, the total width of the array of orifices 70 is substantially less than the minimum diameter ("$D_{MIN}$") of preform substrate 128. For example, the total width of the array of orifices 70 may be less than one-half the minimum diameter ("$D_{MIN}$") of preform substrate 128. Also, the length ("$L_A$") of the array of orifices 70 (see FIG. 8) may be between 50% and 100% of the length ("$L_T$") of the soot growth surface of the tapering-diameter portion of preform substrate 128.

Preform substrate 128 initially may comprise a conventional glass seed rod used in VAD or similar processes. As the process proceeds and soot is deposited on the seed rod, preform substrate 128 may be referred to as a soot body or soot core. As such a seed rod, soot body, or other preform substrate 128 and its use in VAD or similar processes are well understood by one of ordinary skill in the art, such aspects are not described in further detail herein. Similarly, as the manner in which the seed rod is retained and rotated or otherwise manipulated in VAD or similar processes are well understood by one of ordinary skill in the art, such aspects are not described in further detail herein.

With torch 66 and preform substrate 128 oriented with respect to each other as described above, a plurality of gases are then simultaneously and separately emitted from torch 66 and reacted along the gas stream until they deposit onto the soot growth surface of the preform substrate 128. For example, as indicated by block 130 (FIG. 12), a first orifice may emit a first gas. As indicated by block 132, simultaneously with the emission of the first gas, a second orifice may emit a second gas that is different from the first gas. Stated generally, in this exemplary method each of N orifices (i.e., the total number of orifices) emits a stream of gas separately and independently from the other orifices, and at least some of the gases emitted by the various orifices are different from each other. Accordingly, as indicated by block 134, simultaneously with the emission of other gases from other orifices, an Nth orifice emits a gas. The emission of gases from additional or further orifices is indicated by the ellipsis symbol (" . . . ") between blocks 132 and 134.

In an example, the first gas may be a glass precursor, such as silicon tetrachloride, emitted by first orifice 74 (FIG. 8). Also in this example, the second gas may be an inert gas, such as argon, helium or nitrogen, emitted by both second and third orifices 76 and 78. Further in this example, a third gas may be hydrogen, emitted by both fourth and fifth orifices 80 and 82. Still further in this example, a fourth gas may be oxygen, emitted by both sixth and seventh orifices 84 and 86. Still other gases may be emitted by still other orifices.

Although not shown for purposes of clarity, gas sources may be coupled to gas inlets 108 in a manner similar to that described above with regard to the embodiment shown in FIG. 9. The gases are emitted from orifices 74-86 in the direction indicated by the arrows in FIG. 11 toward the surface of preform substrate 128. At least some of the gases, such as the first, second, and third gases, react to form a soot on the surface of preform substrate 128. In accordance with conventional VAD principles, preform substrate 128 is rotated to promote even soot deposition along the circumference of preform substrate 128. In accordance with well-understood VAD principles, as the soot grows, preform substrate 128 is drawn upwardly (i.e., away from torch 66) to maintain a constant maximum diameter ("$D_{MAX}$"). As orifices 74-86 are narrower adjacent the narrower end ("$D_{MIN}$") of preform substrate 128 and wider adjacent the wider end ("$D_{MAX}$") of preform substrate 128, more soot per unit of time is deposited on the wider end of preform substrate 128 than the narrower end of preform substrate 128, resulting in substantially uniform soot density on preform substrate 128.

Although not described herein for purposes of clarity, the method may include additional steps associated with conventional VAD or similar processes. In view of the descriptions herein, one of ordinary skill in the art readily will be capable of using torches in accordance with the present invention in association with conventional VAD or similar processes.

One or more illustrative or exemplary embodiments of the invention have been described above. However, it is to be understood that the invention is defined by the appended claims and is not limited to the specific embodiments described.

What is claimed is:

1. A torch for fabricating optical fiber preforms, comprising:
a torch body having a surface and a plurality of slit-shaped orifices on the surface, each slit-shaped orifice having a longitudinal axis, a first end, and a second end, the slit-shaped orifices oriented substantially parallel to each other at the first ends, a central slit-shaped orifice of the plurality of slit-shaped orifices having a straight longitudinal axis, at least two of the plurality of slit-shaped orifices located on opposing sides of the central slit-shaped orifice and having curving longitudinal axes diverging away from the central slit-shaped orifice and from each other toward the second ends, the torch body further including a plurality of conduits, a proximal end of each conduit coupled to a different one of the slit-shaped orifices, wherein each of the slit-shaped orifices increases in width from its first end to its second end.

2. The torch of claim 1, wherein the proximal end of each conduit is elongated in a direction normal to the surface.

3. The torch of claim 2, wherein each conduit comprises a bore in the torch body elongated in the direction normal to the surface.

4. The torch of claim 1, wherein:
the plurality of slit-shaped orifices comprises a first slit-shaped orifice, a second slit-shaped orifice, and a third slit-shaped orifice; and
the plurality of conduits comprises a first conduit having a proximal end connected to the first slit-shaped orifice, a second conduit having a proximal end connected to the second slit-shaped orifice, and a third conduit having a proximal end connected to the third slit-shaped orifice.

5. The torch of claim 4, wherein:
the plurality of slit-shaped orifices further comprises a fourth slit-shaped orifice and a fifth slit-shaped orifice; and
the plurality of conduits further comprises a fourth conduit having a proximal end connected to the fourth slit-shaped orifice, and a fifth conduit having a proximal end connected to the fifth slit-shaped orifice.

6. The torch of claim 1, wherein a distal end of each conduit has a slit-shaped orifice.

7. The torch of claim 6, further comprising a manifold connected to the distal end of a conduit, the manifold coupling a plurality of inlets to the slit-shaped orifice of the distal end of the conduit.

* * * * *